United States Patent
Clement et al.

(10) Patent No.: US 6,856,266 B2
(45) Date of Patent: Feb. 15, 2005

(54) MULTI-RATE ANALOG-TO-DIGITAL CONVERTER

(75) Inventors: Patrick Clement, Bussigny (CH); Nadim Khlat, Cugnaux (FR); Daniel B Schwartz, Gold Canyon, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/490,875

(22) PCT Filed: Sep. 9, 2002

(86) PCT No.: PCT/EP02/10129

§ 371 (c)(1),
(2), (4) Date: Sep. 7, 2004

(87) PCT Pub. No.: WO03/030372

PCT Pub. Date: Apr. 10, 2003

(65) Prior Publication Data

US 2005/0001748 A1 Jan. 6, 2005

(30) Foreign Application Priority Data

Sep. 28, 2001 (EP) .............................. 01402509

(51) Int. Cl.[7] .......................... H03M 3/00; H03M 7/00; H03M 1/00
(52) U.S. Cl. .......................... 341/143; 341/61; 341/123
(58) Field of Search ................. 341/143, 123, 341/155, 61; 375/244; 704/500

(56) References Cited

U.S. PATENT DOCUMENTS

| | | | |
|---|---|---|---|
| 5,856,796 A | | 1/1999 | Akune et al. |
| 6,542,094 B1 | * | 4/2003 | Venkitachalam et al. ..... 341/61 |
| 6,584,145 B1 | * | 6/2003 | Camagna et al. ........... 375/216 |
| 6,608,572 B1 | * | 8/2003 | Venkitachalam et al. ..... 341/61 |

FOREIGN PATENT DOCUMENTS

| | | | |
|---|---|---|---|
| EP | 794621 | * | 9/1997 |
| EP | 1 120 915 A1 | | 8/2001 |

OTHER PUBLICATIONS

PCT/EP02/10129 PCT Search Report mailed Mar. 6, 2003.

* cited by examiner

*Primary Examiner*—Patrick Wambley (57) ABSTRACT

A Multi-Rate Analog-to-Digital Converter (19) is coupled to a single crystal oscillator (17) as a reference clock and has at least two separate channels arranged to sample and convert input data at two differing clock rates. Each channel derives a clock signal from the reference clock. Associated with each of the channels is a Sigma-Delta converter (10a, 10b) comprising a modulator (12), a filter (14) and a resampler (18). The modulator (12) receives input data and provides a data signal to the filter (14), which itself provides a filtered data signal to the associated data resampler. The data resampler resamples the data and provides a digital output signal. As there is sampling in the digital domain the advantages associated with signal processing, speed and low noise injection are obtained. Similarly as the output of the modulator (12) is in digital form, it can be manipulated and processed readily and with the existing software.

20 Claims, 5 Drawing Sheets

Output from the Sigma-Delta Modulator
at 8x-WCDMA clock rate

Fig. 4

Output from the Low Pass Filter
at 8x-WCDMA clock rate

Fig. 5

Output from the Resampler
at 2x-GSM clock rate

MULTI-RATE ANALOG-TO-DIGITAL CONVERTER

BACKGROUND OF THE INVENTION

This invention re lates generally to Analog to Digital Converters (ADC's) and more particularly to Multi-Rate ADC's.

Analog to Digital Converters (ADC's) are used in a myriad electronic devices. An example of one type of device that incorporates an ADC is a multi-mode receiver. A multi-mode receiver is used in telecommunication equipment such as a mobile telephone or digital tuner.

Multimode receivers use crystal oscillators to generate a single output frequency referred to as a clock frequency. Different carrier signals require different clock frequencies in order to demodulate them. The clock frequencies and other protocols vary according to different standards. For example, the GSM standard requires cocks to operate at 270.833 kHz or at multiples thereof, whereas Wideband Coded Divisional Multiplexed Access standard (WCDMA) operates at 3.84 MHz or multiples thereof. Because there is no direct way of deriving one frequency from another, multi-mode devices, operating at different standards, need to have separate clocks capable of generating different clock reference frequencies. So called multi-clock arrangements are not only expensive, but also add size and complexity to portable devices, such as mobile telephones.

Increasingly, because demands placed upon channel carrying capacity are becoming more exacting the requirements imposed by international Telecommunication Standards on such features as sensitivity level, are also becoming more stringent. Another drawback of such multi clock arrangements is that there is an increased risk of cross-talk and frequency mixing. When this occurs an intolerable amount of noise may be introduced into a system, to such a degree, that the performance of the ADC may not meet the Signal to Noise Ratio (SNR) and noise floor levels and may not allow telephones to meet the sensitivity levels demanded by some of the standards.

PRIOR ART

A solution to this problem has been to use a crystal reference and a phase locked loop (PLL) capable of generating frequencies across a broad spectrum. However, these not only add complexity, but also increase the size of the circuits or radios. Furthermore when the frequencies are high, there is a risk that they mix together due to parasitic coupling. This is highly undesirable because a large spectrum of frequencies is inherent in a clocked square wave, it is likely that some harmonic frequencies which are generated will interfere one with another.

An article of relevance is entitled "Sample Rate Conversion for Software Radio" and was published in IEEE Communications Magazine in August 2000, by T. Hentschel and M. Akune. The article describes a fractional Sample Rate Converter (SRC) for a software definable radio, with examples supporting GSM, IS-95 and UMTS. This fractional SRC allows analog-to-digital conversion to be done at a fixed clock rate for different communication standards, because a conversion to the sample rate, dedicated to each communication standard, is operated by software. However, this fractional sample rate conversion requires using both interpolation and decimation functions.

A partial solution is described in U.S. Pat. No. 5,856,796 (SONY), which describes a method of sample rate conversion using interpolators and decimators. The method is particularly applicable for audio sampling.

Another solution has been proposed for high quality audio signal processing and conversion as its main objective. It is disclosed in U.S. Pat. No. 5,880,980 (ROCKWELL CORPORATION). A distributed decimation is described, which ends with a sample rate conversion. This technique allows the conversion rate in the final sample rate converter to be limited to a range between 1 and 2 thus, saving memory.

The aforementioned solutions are effective. However, no advantage is taken to reduce the processing requirements of components such as oscillators or phase locked loops (PLL's). Furthermore there is no teaching provided which overcomes the problem associated with operating using two different reference clocks. A reason for this may be that implementation of some of these alternatives are not always straightforward. For example a single crystal oscillator, in conjunction with a phase locked loop (PLL) has the disadvantage of introducing analog signals, with associated noise problems. Moreover, these proposed techniques require using both interpolators and decimators which represents a significant increase in of signal processing and cost.

An object of the present invention is to solve the aforementioned problems, by providing an improved Multi-Rate Analog-to-Digital Converter (MRADC).

SUMMARY OF THE INVENTION

According to the present invention there is provided a Multi-Rate Analog-to-Digital Converter coupled to a single crystal oscillator as a reference clock and having at least two separate channels arranged to sample a nd convert in put data at two differing clock rates, each channel deriving a clock signal from said reference clock; associated with each of the channels is a Sigma-Delta converter the Sigma-Delta converter comprises a Sigma-Delta modulator, a filter and a resampler; the Sigma-Delta modulator receives input data and provides a data signal to the filter, which itself provides a filtered data signal to the associated data resampler; the data resampler resamples the data and provides a digital output signal.

Advantageously re-sampling is controlled by an output signal of a clock synthesizer, deriving an appropriate clock rate from the reference clock, or an integer sub-multiple of the reference clock by means of a phase accumulator coupled to a comparator.

Preferably the frequency of the reference clock is an integer multiple of the maximum rate at which the Sigma-Delta converter operates.

Where there are two or more channels, the conversion performed in each channel, may be simultaneous or time multiplexed.

As there is sampling in the digital domain the advantages associated with signal processing, speed and low noise injection are obtained. Similarly as the output of the Sigma-Delta modulator is in digital form, it may be manipulated and processed readily and with existing software. Furthermore as Sigma-Delta modulators tend to oversample: that is they tend to sample at frequencies in excess of the Nyquist rate; configuration of the decimators is relatively straight-forward and this greatly eases post processing of the Sigma-Delta modulator output signal. An advantage of this is that there is no longer a requirement to include an additional PLL for each mode of a multi-mode receiver.

Preferably the frequencies at each of the desired rates at which data is sampled are integer multiples of the highest standard frequency rate of the signals to be converted. For example, in a MRADC having to convert both WCDMA and GSM signals, considering that the so-called 1× rate for each of these standards is 3.84 MHz and 270.833 kHz respectively, data is sampled at integer multiples of the 3.84 MHz rate in each of the channels. For example, the sampling rate could be 15.36 MHz (4×-WCDMA rate), 30.72 MHz (8×-WCDMA rate) or 46.08 MHz (12×-WCDMA rate) in the Sigma-Delta modulator.

Preferably the frequencies at each of the desired rates at which data is resampled at the last stage of the decimator is an integer multiple of the so-called 1× rate for each of the standard signals to be converted by its respective channel. For example, data could be resampled at 15.36 MHz (4×-WCDMA rate) in the channel handling WCDMA signals while data could be resampled at 541.667 kHz (2×-GSM rate) or 270.833 kHz (1×-GSM rate) in the channel handling GSM signals. Provided the ratio between the sampling rate of the Sigma-Delta modulator and the 1×rate of the standard signal converted by each channel is sufficiently large (typically larger than 8), then any quantisation noise occurring in the Sigma-Delta modulator is kept to a minimum in the desired signal band. Decimation is then advantageously carried out between the data source, that is the Sigma-Delta modulator output, and the data sink, namely the output of the resampler. The decimation process provides low pass filtering which may remove as much as needed of any out-of-band noise, such that harmonics of square wave signals re-sampling the output signal at the desired output rate, will only remove or fold a negligible contribution of the out-of-band noise in the desired signal band at the time re-sampling is done.

A regenerator can be arranged to recycle at a sub-multiple of the reference clock frequency the data in the resampler. The recycling may be done at an integer sub-multiple or at a fractional sub-multiple of the reference lock frequency.

The regenerator is a digital clock synthesizer comprising: a phase accumulator and a comparator. Accuracy of the resampling signal frequency is determined by the number of bits (q) used for accumulating the phase value of the resampling signal. The phase accumulator is activated by the reference clock or by an integer sub-multiple of the reference clock. The frequency of the resampling signal ($f_x$) is determined by the number of bits (q), by the frequency ($f_{ref}/\alpha$) of the clock activating the phase accumulator and by the phase increment (p) added at each period of the activating dock according to the well known following function:

$$f_x = (p/2^q) \cdot f_{ref}/\alpha$$

If q is large enough then it is possible to obtain a high degree of accuracy in generating the resampling signal in the relevant mode.

Sample rate conversion (SRC) can impose significant demands upon a Digital Signal Processor (DSP) because interpolators and decimators are employed. However, inclusion of a low pass filter (LPF) in any Sigma-Delta converter enables decimation. As a result of the oversampling and quantisation noise shaping that occur in the modulator, decimation drastically attenuates the noise components that may fall into the desired signal band after resampling. The inventors have realised that this feature may be employed to improve the noise floor levels of a Multi-Rate Analog-to-Digital Converter as well as reduce any allasing that may occur.

By including a low pass filter (LPF) at the output of the, or each, Sigma-Delta modulator, a lower sampling rate can be achieved at the re-sampler, for example from a system clock frequency of 30.72 MHz to a choice of lower frequencies. The clock synthesiser is coupled to a clocked control switch and advantageously is able to vary the rates at which clocking occurs. Effectively therefore a variable frequency clock is achievable. Typically the clock rate is 270.833 kHz or 541.666 kHz for the GSM channel.

According to another aspect of the invention there is provided a method of Analog-to-Digital Conversion comprising the following steps: deriving a reference clock frequency suitable for input to at least two separate channels at two differing clock rates, each channel is arranged, in use, to sample and convert input data at the two differing clock rates; deriving a clock signal from said reference lock; modulating data in each channel using a Sigma-Delta modulator; receiving input data from the Sigma-Delta modulator, low pass filtering the data signal so as to provide a data signal to an associated data re-sampler, said re-sampler re-samples the data thereby providing a digital converted output Resampling the signal at a rate close to or equal to the 1× rate of the standard signal in each channel avoids the need for introducing a now high frequency reference clock and associated problems of harmonic interference between several high frequency reference docks. Preferred embodiments of the invention will now be described, by way of examples only, and with reference to the Figures in which:

DETAILED DESCRIPTION OF THE INVENTION

Figure 1:
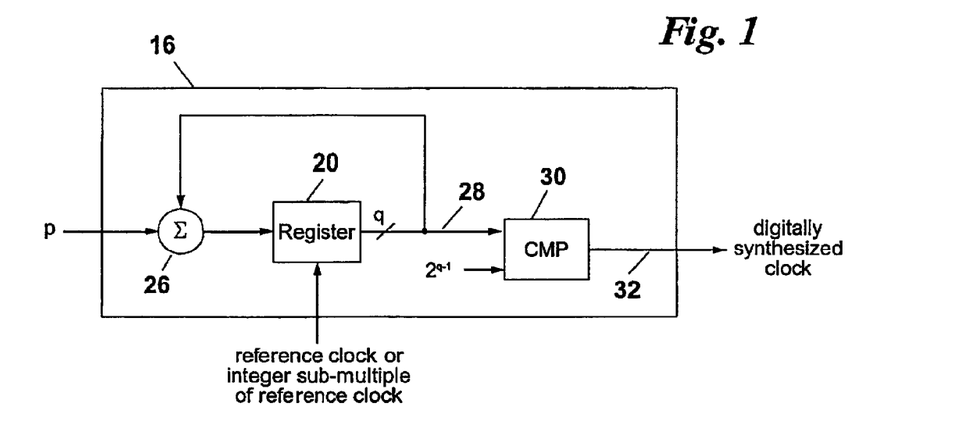
FIG. 1 is a simplified block diagram of a clock synthesizer.

Referring to the Figures, FIG. 1 shows a diagrammatical representation of a Clock Synthesizer 16. The input parameter, p, is selected according to the main clock (not shown) frequency, $f_{ref}/\alpha$, the output frequency to generate, $f_x$, and the number of bits, q, used to accumulate the phase of the output dock signal. A register 20 receives an input from adder 26 and is activated by an input clock which is an integer sub-multiple of the reference clock (not shown). Alternatively the register could be clocked by the reference clock itself. Consequently, the frequency of the clock activating register 20 is given by $f_{ref}/\alpha$, where a is an integer number larger or equal to 1. Register 20 is part of a closed loop also comprising the adder 26. The closed loop accumulates a phase count by means of an increment, p, added to another input of the adder 26. The register 20 presents its output 28 to a Comparator 30. Comparator 30 compares output from register 20 with a value derived from $2^{q-1}$. Output 32 from the comparator 30 is therefore in the form of a digitally synthesised clock whose frequency is given by.

$$f_x = (p/2^q) \cdot f_{ref}/\alpha$$

Figure 2:
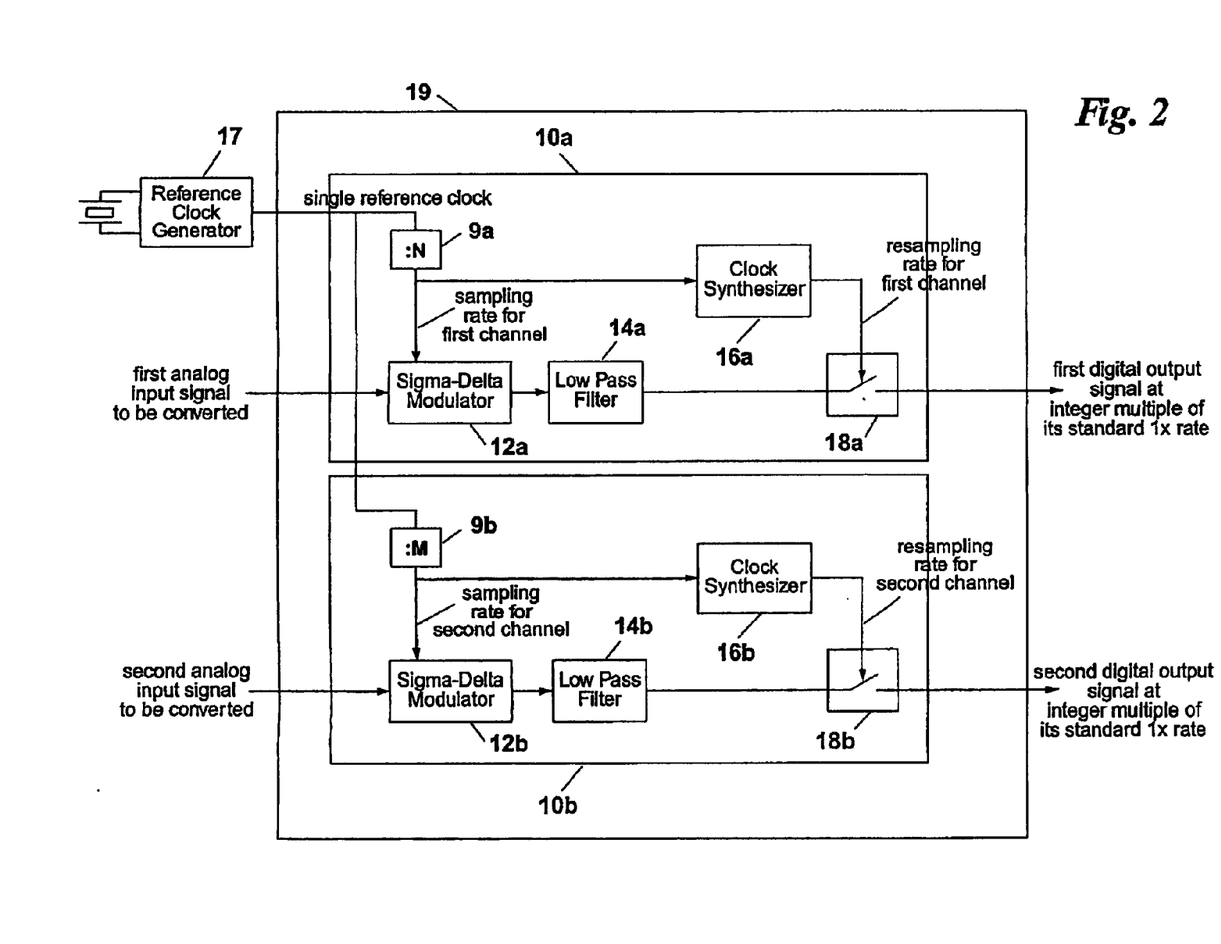
FIG. 2 is a block diagram of a preferred embodiment of the invention.

FIG. 2 shows a Multi-Rate Analog-to Digital converter 19 comprising two Sigma-Delta converters 10a and 10b. A reference clock generator 17 provides an output signal called the single reference clock. For example the frequency of this clock may be 30.72 MHz, which is the 8×-WCDMA rate. Each Sigma-Delta converter 10a and 10b is configured to operate at a different frequency channel. Each frequency can support a particular standard. In a particularly preferred embodiment converter 10a handles a WCDMA signal and converter 10b handles a GSM signal. In a general case, each Sigma-Delta converter comprises a clock divider 9, a Sigma-Delta modulator 12, a Low Pass Filter 14, a Clock Synthesizer 16 and a re-sampling switch 18.

In the particular case of the above example, shown in FIG. 2, clock divider 9a is reduced to a bypass connection as reference clock is directly applied to Sigma-Delta modulator 12a; while clock divider 9b achieves a frequency division by a factor of 2. This is equivalent to allowing parameter N to equal 1 and parameter M to equal 2.

Therefore Sigma-Delta modulator 12 over samples and quantises each input signal, producing a digital output at the sampling rate relative to each channel. The digital output of the Sigma-Delta modulator 12 is a function of the input signal and of the quantisation noise.

The signal at the output of the Sigma-Delta modulator 12 is filtered by Low Pass Filter 14. Thus, most of any out-of-band noise components are drastically attenuated.

Clock synthesizer 16 is clocked by a reference clock 17 after it has been divided by the appropriate integer factor for each channel. Clock Synthesizer 16 delivers a control signal to the switch 18. In the first Sigma-Delta converter 10a the first analog input signal may for example be sampled at the 8×-WCDMA rate of 30.72 MHz in the modulator 12a and may then be decimated by a factor 2, down to the 4×-WCDMA rate of 15.76 MHz by a low pass filter (LPF) 14a, the Clock Synthesizer 16a and the re-sampling switch 18a. The output signal from clocked switch 18a Is then suitable for handling WCDMA signals.

In the second Sigma-Delta converter 10b the second analog input signal may for, example, be sampled at the 4×-WCDMA rate of 15.36 MHz in the modulator 12b and may then be decimated down to the 2×-GSM rate of 541.667 kHz by means of LPF 14b, Clock Synthesizer 16b and the re-sampling switch 18b. The output signal from clocked switch 18b Is then suitable for handling GSM signals.

In the example given for converter 10a the signal at the output of the Sigma-Delta modulator only needs to be decimated by a factor of 2. Clock Synthesizer 16a may then be reduced to a simple frequency divider by a factor of 2, which is well known from those skilled in this art. Nevertheless, the signal at the output of Sigma-Delta Modulator 12b needs to be decimated by a non-integer factor and this requires Clock Synthesizer 16b to be realised by means of an arrangement such as described in FIG. 1.

Figure 3:
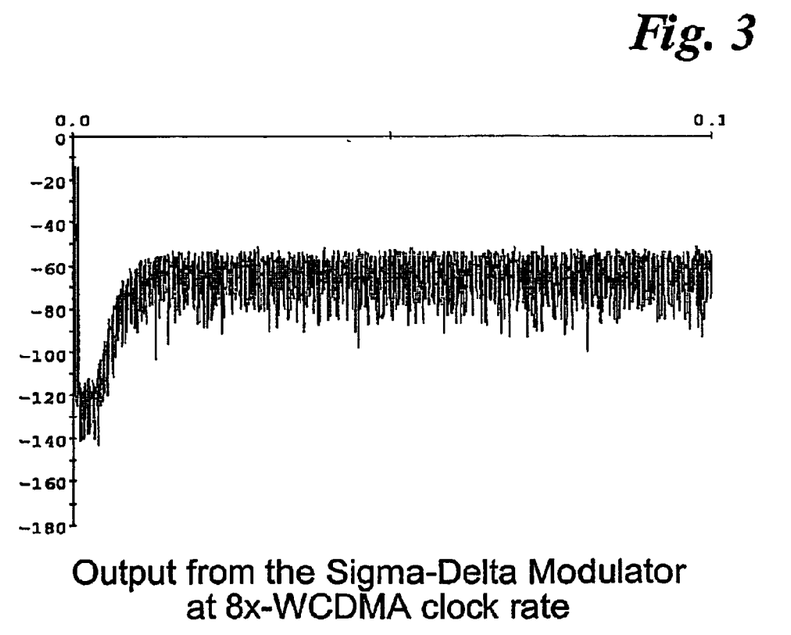
FIG. 3 is a graph showing output from the Sigma-Delta modulator at 8×-WCDMA clock rate.

FIG. 3 shows the frequency spectrum of the signal at the output of the Sigma-Delta Modulator 12b using the above example circuit of FIG. 2. The sampling rate at this point is 15.36 MHz and the horizontal scale is expressed relative to this frequency. The frequency range extends to 1.536 MHz. For the sake of simplicity, the second analog input signal is a 2-tone signal instead of the regular GMSK-modulated signal in use in the GSM standard. Therefore, at the output of the Sigma-Delta Modulator, these two tones may be noticed on the left-hand side of the spectrum corresponding to low frequencies while most of the quantisation noise produced by the Sigma-Delta modulation loop may be observed at upper frequencies.

Figure 4:
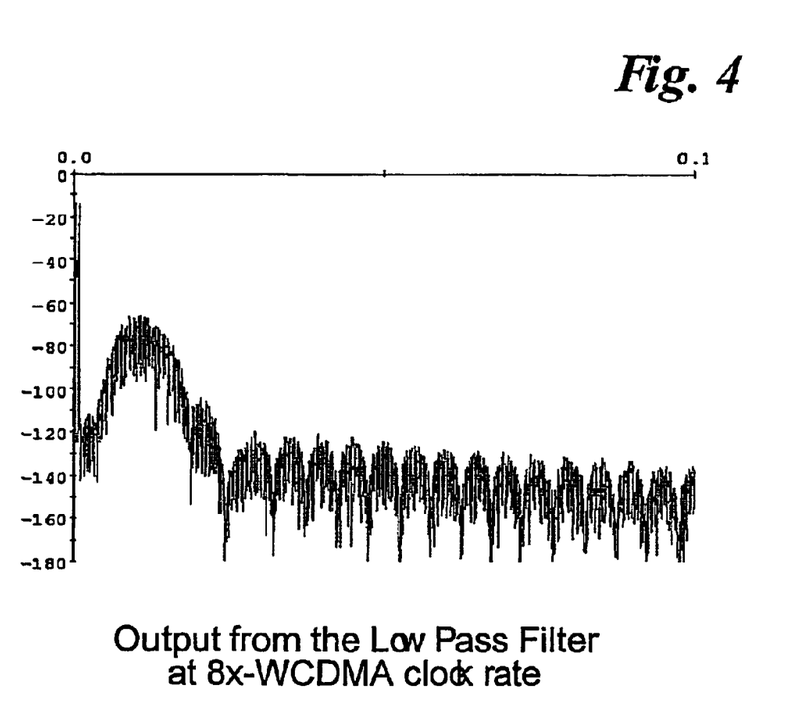
FIG. 4 is a graph showing the output from the low pass filter at 8×-WCDMA rate.

FIG. 4 shows the frequency spectrum of the signal at the output of the Low Pass Filter 14b. The horizontal scale still relates to the sampling rate of 15.36 MHz. The two low frequency tones have not been modified but most of the high frequency noise has been significantly attenuated.

Figure 5:
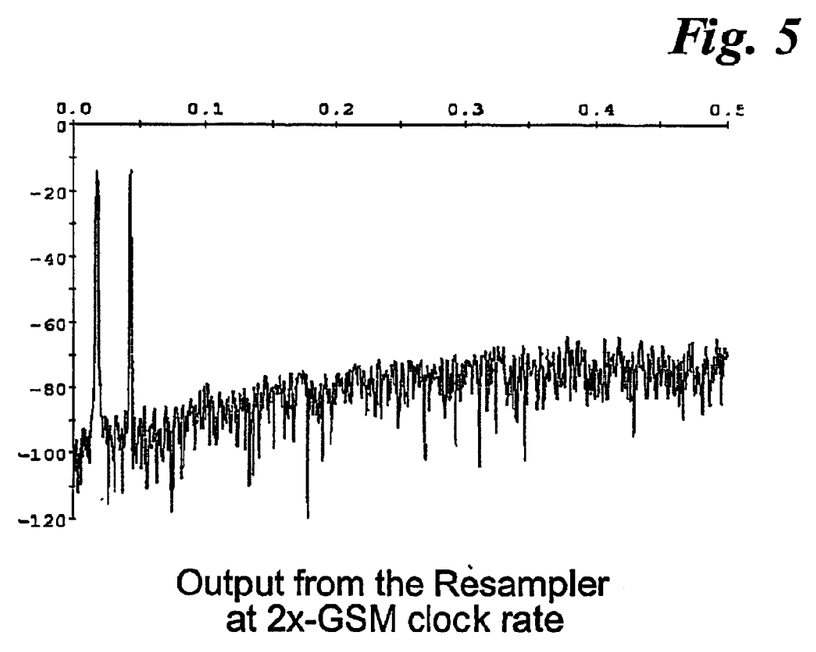
FIG. 5 is a graph showing the output of the MRADC after resampling the signal at 2×-GSM clock rate.

FIG. 5 shows the frequency spectrum of the signal at the output of the re-sampling switch 18b. Here, the signal has been resampled at 541.667 kHz. Thus, the horizontal scale spans up to 0.5×541.667 kHz=270.833 kHz. The two low frequency tones have not been modified. The noise level presents a shaping which is typical of a low frequency portion produced by a Sigma-Delta modulation loop. This indicates that the amount of high frequency noise, which has been aliased by interference with the harmonics of the re-sampling dock signal, is negligible. The attenuation provided by Low Pass Filter 14 is sufficient to achieve this goal.

The Multi-Rate Analog-to-Digital Converter of FIG. 2 may be extended to more than two channels by adding further Sigma-Delta converters 10a and 10b. Furthermore, as this arrangement does not require the decimating factor to be an integer, it may be seen that many different sorts of signals can be supported in addition to or instead of WCDMA and GSM. Appropriate parameters need to be set in the Clock Synthesizer in order to allow proper decimation between the clock rate at the output of the Sigma-Delta Modulator and the clock rate after re-sampling. Additionally, the sampling rate in the Sigma-Delta Modulator and the re-sampling rate may be adapted to each standard in order to provide sufficient over sampling and to allow for efficient quantisation noise shaping in the modulator and effective attenuation of out-of-band noise components in the Low Pass Filter.

The over-sampling ratio between both clock rates is related to the amount of noise aliased in the signal band by the re-sampling operation due to the harmonics of the re-sampling square wave signal. Knowing this over sampling ratio and the amount of in-band acceptable noise at the corresponding Sigma-Delta converter output, the efficiency of the Low Pass Filter must be adjusted accordingly.

Table 1 shows a range of different desired output rates and how to obtain these in the particular case of using a single reference clock rate of 30.72 MHz

| Single reference clock | Sampling rate in Sigma-Delta Modulator | Phase increment 'p' in Clock Synthesizer | Number of phase bits 'q' in Clock Synthesizer | Re-sampling frequency | Equivalent rate | Supported signals |
|---|---|---|---|---|---|---|
| 30.72 MHz | 30.72 MHz | — | — | 15.36 MHz | 8×-WCDMA | WCDMA |
| 30.72 MHz | 30.72 MHz | 4'469'555 | 26 | 2.046 MHz | 2×-GPS | GPS |
| 30.72 MHz | 15.36 MHz | 2'366'578 | 26 | 541.667 kHz | 2×-GSM | GSM |

-continued

| Single reference clock | Sampling rate in Sigma-Delta Modulator | Phase increment 'p' in Clock Synthesizer | Number of phase bits 'q' in Clock Synthesizer | Re-sampling frequency | Equivalent rate | Supported signals |
| --- | --- | --- | --- | --- | --- | --- |
| 30.72 MHz | 3.84 MHz | 1'698'693 | 26 | 97.2 kHz | 2x-IS136 | IS136 |

In the cases where different sorts of signals do not need to be processed simultaneously but during dedicated periods of time, the Sigma-Delta converters 10a and 10b In FIG. 2 do not need to be physically implemented. A single Sigma Delta Converter could be implemented and multiplexed over time with different sets of parameters related to each of the signals to be handled. This, as well as re-configuration of the standards, may be achieved by and under control of dedicated software.

The invention has been described by way of example only and it will be appreciated that variation may be made to the embodiments described, without departing from the scope of the invention.

What is claimed is:

1. A Multi-Rate Analog-to-Digital Converter coupled to a single crystal oscillator as a reference clock, said Multi-Rate Analog-to-Digital Converter comprising: at least two separate channels arranged to sample and convert input data at two differing clock rates, each channel deriving a clock signal from said reference clock, wherein each of the channels includes a Sigma-Delta converter, the Sigma-Delta converter including a Sigma-Delta modulator, a filter and a data resampler wherein the Sigma-Delta modulator receives input data and provides a data signal to the filter, wherein the filter provides a filtered data signal to the associated data resampler, and wherein the data resampler resamples the data and provides a digital output signal.

2. The Multi-Rate Analog-to-Digital Converter (MRADC) according to claim 1, wherein the filter in the Sigma-Delta converter is a decimation filter.

3. The Multi-Rate Analog-to-Digital Converter (MRADC) according claim 2 wherein the decimation filter is a low pass filter.

4. The Multi-Rate Analog-to-Digital Converter (MRADC) according to claim 2, wherein sigma-delta modulation and decimation only are carried out between a data source and a data sink.

5. The Multi-Rate Analog-to-Digital Converter (MRADC) according to claim 1, wherein a regenerator is arranged to recycle signals at an integer sub-multiple of the reference clock frequency.

6. The Multi-Rate Analog-to-Digital Converter (MRADC) according to claim 5, wherein a regenerator is arranged to produce a resampling clock signal from the reference clock signal by means of a phase accumulator and a comparator.

7. The Multi-Rate Analog-to-Digital Converter (MRADC) according to claim 6, wherein the frequency accuracy of the re-sampling clock determines the number of bits (q) used to express the phase of the resampling clock in the regenerator.

8. The Multi-Rate Analog-to-Digital Converter (MRADC) according to claim 6, wherein the frequency ($f_x$) of the resampling clock is determined by the phase increment (p) added at every period of the sampling clock, the sampling clock frequency ($f_{ref}/\alpha$) and the number of bits (q) used to express the phase of the resampling clock.

9. The Multi-Rate Analog-to-Digital Converter (MRADC) according to claim 5, wherein a regenerator is arranged to produce a resampling clock signal from an integer sub-multiple of the reference clock by means of a phase accumulator and a comparator.

10. The Multi-Rate Analog-to-Digital Converter (MRADC) according to claim 9, wherein a regenerator if arranged to produce a resampling clock signal from an integer sub-multiple of the reference clock by means of a phase accumulator and a comparator.

11. The Multi-Rate Analog-to-Digital Converter (MRADC) according to claim 9, wherein the frequency accuracy of the re-sampling clock determines the number of bits (q) used to express the phase of the resampling clock in the regenerator.

12. The Multi-Rate Analog-to-Digital Converter (MRADC) according claim 5, wherein a regenerator is arranged to recycle signals at a fractional sub-multiple frequency of the reference clock frequency.

13. The Multi-Rate Analog-to-Digital Converter (MRADC) according to claim 1, wherein the Sigma-Delta converter comprises a Sigma-Delta modulator and a plurality of successive decimation filters.

14. The Multi-Rate Analog-to-Digital Converter (MRADC) according to claim 1, wherein the at least two separate channels include using a single Sigma-Delta converter is used and is adapted to be operated upon first and second signals in a time multiplexed manner, so as to convert first and second input signals at different sampling rates.

15. The Multi-Rate Analog-to-Digital Converter (MRADC) according to claim 1, wherein data at the input of at least one channel is sampled at the reference clock rate.

16. The Multi-Rate Analog-to-Digital Converter (MRADC) according to claim 1, wherein the data at the input of at least one channel is sampled at an integer sub-multiple of the reference clock.

17. The Multi-Rate Analog-to-Digital Converter (MRADC) according to claim 1, wherein at least one Sigma-Delta converter is arranged to sample data at frequency of 46.08 MHz.

18. The Multi-Rate Analog-to-Digital Converter (MRADC) according to claim 1, wherein at least one Sigma-Delta converter is arranged to sample data at frequency of 30.72 MHz.

19. The Multi-Rate Analog-to-Digital Converter (MRADC) according to claim 1, wherein at least one Sigma-Delta converter is arranged to sample data at frequency of 15.36 MHz.

20. A method of Analog-to-Digital Conversion comprising: deriving a reference clock frequency suitable for input to at least two separate channels at two differing clock rates, each channel is arranged, in use, to sample and convert input data at the two differing clock rates; deriving a clock signal from said reference clock; modulating data in each channel using a Sigma-Delta modulator; receiving input data from the Sigma-Delta modulator; low pass filtering the data signal so as to provide a data signal to an associated data re-sampler, said re-sampler re-samples the data thereby providing a digital converted output.

* * * * *